United States Patent
Hsu et al.

(10) Patent No.: US 8,149,562 B2
(45) Date of Patent: Apr. 3, 2012

(54) SYSTEM FOR DECHARGING A WAFER OR SUBSTRATE AFTER DECHUCKING FROM AN ELECTROSTATIC CHUCK

(75) Inventors: Yen-Hsiang Hsu, Kaoshiung (TW); Jeng-Yann Tsay, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 573 days.

(21) Appl. No.: 11/684,280

(22) Filed: Mar. 9, 2007

(65) Prior Publication Data

US 2008/0218931 A1    Sep. 11, 2008

(51) Int. Cl.
*H01L 21/683* (2006.01)
(52) U.S. Cl. ............................................ 361/234
(58) Field of Classification Search .................. 361/234
See application file for complete search history.

(56) References Cited

U.S. PATENT DOCUMENTS

| | | | |
|---|---|---|---|
| 5,459,632 A | 10/1995 | Birang et al. | |
| 5,708,250 A | 1/1998 | Benjamin et al. | |
| 5,818,682 A * | 10/1998 | Loo | 361/234 |
| 5,872,694 A * | 2/1999 | Hoinkis et al. | 361/234 |
| 6,187,149 B1 * | 2/2001 | Sun et al. | 204/164 |
| 6,198,616 B1 * | 3/2001 | Dahimene et al. | 361/234 |
| 6,307,728 B1 * | 10/2001 | Leeser | 361/234 |
| 6,430,022 B2 * | 8/2002 | Leeser | 361/234 |

* cited by examiner

*Primary Examiner* — Jared Fureman
*Assistant Examiner* — Ann Hoang
(74) *Attorney, Agent, or Firm* — Duane Morris LLP

(57) ABSTRACT

A system for decharging a wafer or substrate disposed on an electrostatic chuck, includes a capacitance detector for measuring a capacitance between the electrostatic chuck and the wafer or substrate, and a decharging voltage calculator for calculating a decharging voltage based at least in part on the capacitance measured by the capacitance detector. The decharging voltage calculated by the decharging voltage calculator of the system is applied to the electrostatic chuck after dechucking to substantially neutralize electrostatic charges on the wafer or substrate.

20 Claims, 2 Drawing Sheets

SYSTEM FOR DECHARGING A WAFER OR SUBSTRATE AFTER DECHUCKING FROM AN ELECTROSTATIC CHUCK

FIELD OF THE INVENTION

The present invention relates to electrostatic chucks for holding a wafer or substrate. More particularly, the present invention relates to a system for calculating a decharging voltage to be applied to an electrostatic chuck, to reduce the number of particles that are drawn to the wafer or substrate, and related methods.

BACKGROUND OF THE INVENTION

Various fabrication processes including, without limitation, film deposition, film etching, and wafer or substrate inspection, and the like, are employed during the fabrication of integrated circuits. Such fabrication processes generally require that the semiconductor wafer or substrate be held in a fixed position within the fabrication apparatus.

The wafer or substrate is typically held in a fixed position using an electrostatic chuck (ESC) upon which the wafer or substrate is positioned and fixed by action of an electrostatic charge induced by the ESC. The ESC typically comprises a wafer support member formed of a dielectric material, an electrically conductive electrode and a high voltage power source (e.g., DC power supply) for charging the electrode to a high voltage (e.g., 500-700 volts). The electrostatic force that fixes the wafer or substrate to the ESC is generated by the potential difference created between the ESC with the high voltage applied thereto and the electric field applied by RF or microwave electric field generating means to a process gas in the apparatus to produce a plasma therein.

Removal of the wafer or substrate from the ESC (dechucking) may be accomplished by turning off high voltage power source and the electric field generating means. Because the wafer and the ESC are grounded, the electrostatic charge holding the wafer to the ESC drains to ground when the high voltage power source and the electric field generating means are turned off.

A problem with the this dechucking method is that a remnant of the electrostatic charge usually remains on the ESC after dechucking because the electrostatic charge can not drain instantaneously. The remnant electrostatic charge on the ESC attracts particles to the surface of the wafer or substrate. These particles often cause defects in subsequent processing.

Accordingly, an improved dechucking method and apparatus is needed which reduces particle contamination of the wafer or substrate.

SUMMARY

A system is disclosed for decharging a wafer or substrate disposed on an electrostatic chuck. The system comprises a capacitance detector for measuring a capacitance between the electrostatic chuck and the wafer or substrate, and a decharging voltage calculator for calculating a decharging voltage based at least in part on the capacitance measured by the capacitance detector. The decharging voltage calculated by the decharging voltage calculator is applied to the electrostatic chuck to substantially neutralize electrostatic charges on the wafer or substrate.

Also disclosed is an electrostatic chuck comprising a support member for mounting a wafer or substrate and a system for decharging the wafer or substrate. The wafer or substrate decharging system comprises a capacitance detector for measuring a capacitance between an electrode of the support member and the wafer or substrate, and a decharging voltage calculator for calculating a decharging voltage based at least in part on the capacitance measured by the capacitance detector. The decharging voltage calculated by the decharging voltage calculator is applied to the electrode to substantially neutralize electrostatic charges on the wafer or substrate.

Further disclosed is a method for manufacturing an integrated circuit. The method comprises the steps of providing an apparatus comprising a process reaction chamber and an electrostatic chuck disposed in the reaction chamber; chucking a wafer or substrate to the electrostatic chuck; processing the wafer or substrate in the process reaction chamber; dechucking the wafer or substrate; measuring a capacitance between the electrostatic chuck and the wafer or substrate; calculating a decharging voltage based at least in part on the capacitance; and applying the decharging voltage to the electrostatic chuck to substantially neutralize electrostatic charges on the wafer or substrate.

DETAILED DESCRIPTION

Figure 1:
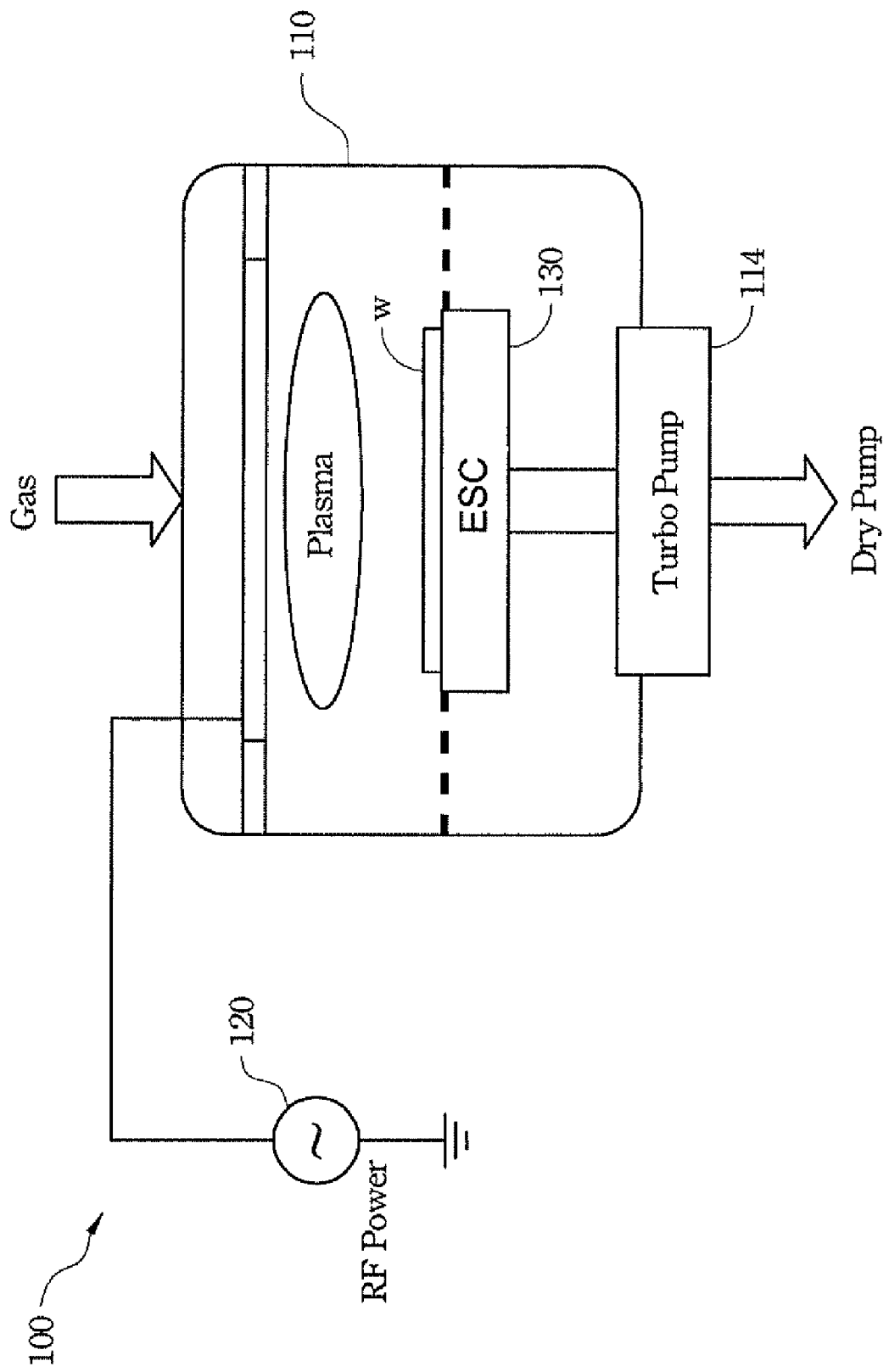
FIG. 1 is a schematic view of an embodiment of a plasma etching apparatus having an electrostatic chuck with a capacitance reaction system for decharging voltage optimization when dechucking.

FIG. 1 is a schematic view of an embodiment of a plasma etching or deposition apparatus 100 having an electrostatic chuck 130 (ESC) with a capacitance reaction system for decharging voltage optimization in order to neutralize a semiconductor wafer or other wafer or substrate W (hereinafter wafer) held by the ESC 130 when dechucking therefrom to reduce the number of particles that are drawn to the wafer. The apparatus 100 includes a reaction chamber 110 evacuated by a vacuum pump 114. A gas source (not shown) supplies gas to be ionized, to the chamber 110 via a shower head (not shown). The gas flowing from the showerhead is excited by an electric field generating device 120 to generate a plasma. The ESC 130 is disposed within the chamber 110 and holds the wafer W to be etched and/or on which a material(s) is to be deposited, using the ions in the plasma.

Figure 2:
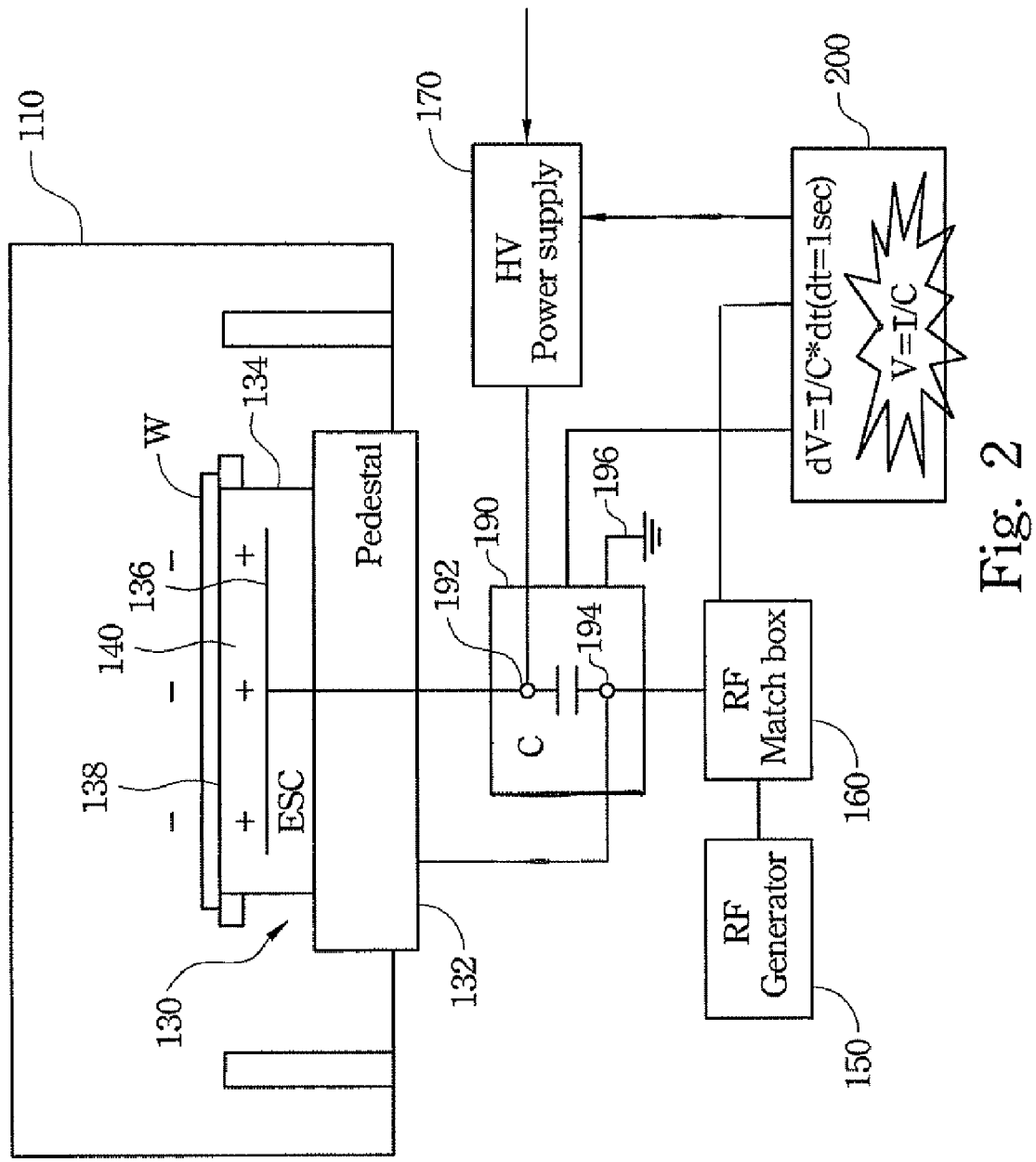
FIG. 2 is a detailed schematic view of an embodiment of the electrostatic chuck with a capacitance reaction system for decharging voltage optimization when dechucking.

In one embodiment, as shown in FIG. 2, the ESC 130 may be a monopolar design comprising a cathode pedestal 132 mounting a dielectric wafer support member 134 having an electrically conductive electrode 136 disposed or embedded therein. The cathode pedestal 132 is typically made of an electrically conductive material, such as aluminum. The dielectric wafer support member 134 may be made of a ceramic material, such as poly crystalline alumina ($Al_2O_3$), sapphire or aluminum nitride (AlN). The dielectric wafer support member 134 has a flat, planar top surface 138 for mounting the wafer W. The ESC electrode 136 is disposed or embedded within the dielectric wafer support member 134 so that a thin portion 140 of the member 134 is disposed above the ESC electrode 136.

The ESC 130, in one embodiment, is energized by a circuit that includes an RF generator 150, an RF matching device 160, and a high voltage (e.g., 500-700 volts) DC power supply 170. A capacitance reaction system is provided for determining the amount of electrostatic charges remaining on the wafer W and the ESC electrode 136, immediately after dechucking and calculating a decharging voltage to be applied by the high voltage DC power supply 170 to neutralize the remaining electrostatic charges on the wafer W and the ESC electrode 136. In one embodiment, the capacitance reaction system includes a capacitance detecting system 190 for measuring the capacitance between the ESC electrode 136 and the wafer W, and a decharging voltage calculating system 200.

Referring still to FIG. 2, the RF generator 150 is connected to the RF matching device 160. The RF matching device 160 matches the impedance of the RF generator output to the ESC 130. The high voltage power supply 170 and the ESC electrode 136 are connected to the capacitance detecting system 190 at first node 192. The cathode pedestal 132, which is grounded, and the RF matching device 160 are connected to the capacitance detecting system 190 at second node 194. The capacitance detecting system 190 is connected to the decharging voltage calculating system 200 and to ground 196. The decharging voltage calculating system 200 is also connected to the high voltage DC power supply 170 and the RF matching device 160.

In the chucking mode, the high DC voltage applied to the ESC electrode 136 and the plasma generated in the chamber 110 cause negative and positive charges to accumulate on the upwardly facing surfaces of the wafer W and the ESC electrode 136, respectively. The opposite polarity charges produce an electrostatic attractive force which draws the wafer W against the top surface 138 of the wafer support member 134 of the ESC 130. After the wafer W is chucked, one or more semiconductor or like fabrication processes (e.g., etching and deposition) may be performed in the chamber 110.

Once processing has been completed in the chamber 110, the wafer W is dechucked by turning off the high voltage DC power supply 170 and the electric field generating device 120, and then, immediately applying a decharging voltage to the ESC electrode 136 using the high voltage DC power supply 170. The decharging voltage applied by the high voltage DC power supply 170 has a polarity that is opposite to the polarity of the chucking voltage and which has a magnitude that is calculated by the capacitance reaction system to neutralize the remaining electrostatic charges on the wafer W and the ESC electrode 136. The magnitude of the decharging voltage is individually calculated by the capacitance system because there is no "optimum" fixed value for the decharging voltage, that works satisfactorily with each wafer or lot of wafers because each wafer or lot of wafers has a different ESC leakage current and capacitance. If the applied decharging voltage is above or below the "optimum" decharging voltage value, remnant charges will remain on the wafer W and the ESC electrode 136, therefore, attracting particles to the wafer W. In the case of the present invention, an optimum decharging voltage is calculated by the capacitance reaction system and applied to the ESC electrode 136 to substantially neutralize remnant charges remaining on the wafer W and the ESC electrode 136, thereby minimizing particle attraction to the wafer W.

In one embodiment, the capacitance reaction system calculates the optimum decharging voltage value for each wafer in a lot of wafers after dechucking that wafer from the ESC 130. In an alternate embodiment, the optimum decharging voltage value is calculated by the capacitance reaction system on a lot by lot basis. For example, a sample of wafers from a wafer lot may be selected and the optimum decharging voltage value for each same wafer is calculated by the capacitance reaction system after dechucking each of the sample wafers from the ESC 130. The optimum decharging voltage values are then averaged and this "average optimum decharging voltage value" is used for decharging the remaining wafers in the wafer lot after dechucking from the ESC 130.

The selection of the optimum decharging voltage output for neutralizing charges on the wafer W and the ESC electrode 136 during wafer W dechucking, may be achieved in one embodiment by measuring the capacitance C between the ESC electrode 136 and the wafer W and leakage current I across the thin portion 140 of the ESC dielectric member 134, and then using these values to calculate the decharging voltage, i.e., the relationship $dV=I/C*dt$ (where dt is a time interval) is used to calculate the voltage of the ESC electrode 136. The voltage of the ESC electrode 136 and voltage of the wafer's surface are mutually a negative value. More specifically, the capacitance detecting system 190, which in one embodiment may comprise any suitable capacitance measuring device (e.g., capacitance bridge or meter), measures the capacitance C between the ESC electrode 136 and ground 196. At the same time, the high voltage DC power supply 170 measures the leakage current I across the thin portion 140 of the ESC dielectric member 134 at the second node 194 over a predetermined time period (t), e.g., one (1) second and then calculates the leakage current I (ECS leakage current). The decharging voltage calculating system 200, which may comprise a software program executed by microprocessor or an electronic circuit, then uses the measured capacitance C and leakage current I values to calculate the decharging voltage V using:

$$dV=I/C*dt,\ \text{e.g., where } dt=1\ \text{second, and } V=I/C.$$

The high voltage DC power supply then applies the decharging voltage V calculated by the decharging voltage calculating system 200 to the ESC electrode 136 to neutralize the remaining electrostatic charges on the wafer W and the ESC electrode 136, to reduce particle contamination of the wafer W.

Although the invention has been described in terms of exemplary embodiments, it is not limited thereto. Rather, the appended claims should be construed broadly to include other variants and embodiments of the invention, which may be made by those skilled in the art without departing from the scope and range of equivalents of the invention.

What is claimed is:

1. A system for decharging a wafer or substrate disposed on an electrostatic chuck, the system comprising:
    a capacitance detector for measuring a capacitance between the electrostatic chuck and the wafer or substrate; and
    a decharging voltage calculator for calculating a decharging voltage for application to the electrostatic chuck based at least in part on the capacitance measured by the capacitance detector,
    wherein the application of the decharging voltage is initiated after completion of dechucking to substantially neutralize electrostatic charges on the wafer or substrate, the decharging voltage having a polarity that is opposite to the polarity of a chucking voltage applied to the electrostatic chuck.

2. The system of claim 1, further comprising a current measuring device for measuring a current across at least a portion of the electrostatic chuck, the decharging voltage calculated by the decharging voltage calculator also based on the current measured across the portion of the electrostatic chuck.

3. The system of claim 2, wherein the current measuring device comprises a power supply associated with the electrostatic chuck.

4. The system of claim 2, wherein the decharging voltage calculator calculates the decharging voltage by multiplying a quotient obtained by dividing the current by the capacitance, by a time period over which the current was measured.

5. The system of claim 1, wherein the capacitance detector includes a capacitance measuring device.

6. An electrostatic chuck comprising:
 a support member for mounting a wafer or substrate, the support member including an electrode; and
 a system for decharging the wafer or substrate, the system comprising:
  a capacitance detector for measuring a capacitance between the electrode and the wafer or substrate; and
  a decharging voltage calculator for calculating a decharging voltage for application to the electrode based at least in part on the capacitance measured by the capacitance detector,
 wherein the application of the decharging voltage is initiated after completion of dechucking to substantially neutralize electrostatic charges on the wafer or substrate, the decharging voltage having a polarity that is opposite to the polarity of a chucking voltage applied to the electrostatic chuck.

7. The electrostatic chuck of claim 6, further comprising a current measuring device for measuring a current across at least a portion of the electrostatic chuck, the decharging voltage calculated by the decharging voltage calculator also based on the current measured across the portion of the electrostatic chuck.

8. The electrostatic chuck of claim 7, wherein the current measuring device comprises a power supply associated with the electrostatic chuck.

9. The electrostatic chuck of claim 7, wherein the decharging voltage calculator calculates the decharging voltage by multiplying a quotient obtained by dividing the current by the capacitance, by a time period over which the current was measured.

10. The electrostatic chuck of claim 6, wherein the capacitance detector includes a capacitance measuring device.

11. A method for manufacturing an integrated circuit, the method comprising the steps of:
 providing an apparatus comprising a process reaction chamber and an electrostatic chuck, the electrostatic chuck disposed in the reaction chamber;
 chucking a wafer or substrate to the electrostatic chuck;
 processing the wafer or substrate in the process reaction chamber;
 dechucking the wafer or substrate;
 measuring a capacitance between the electrostatic chuck and the wafer or substrate;
 calculating a decharging voltage based at least in part on the capacitance, the decharging voltage having a polarity that is opposite to the polarity of a chucking voltage applied to the electrostatic chuck; and
 initiating the application of the decharging voltage to the electrostatic chuck after completion of dechucking to substantially neutralize electrostatic charges on the wafer or substrate.

12. The method of claim 11, further comprising the step of measuring a current across at least a portion of the electrostatic chuck, wherein the calculating step is performed using the current measured across the portion of the electrostatic chuck.

13. The method of claim 12, wherein the current measuring step is performed by a power supply associated with the electrostatic chuck.

14. The method of claim 12, wherein the current measuring step is performed over a time period and wherein the calculating step is performed by multiplying a quotient of the current divided by the capacitance, by the time period.

15. The method of claim 11, wherein the capacitance measuring step is performed by a capacitance measuring device.

16. The method of claim 11, wherein the decharging voltage calculating step is performed by a decharging voltage calculator.

17. The method of claim 11, wherein the processing step comprises wafer or substrate etching.

18. The method of claim 11, wherein the processing step comprises film deposition.

19. The method of claim 11, wherein the apparatus comprises a plasma etching apparatus.

20. The method of claim 11, wherein the apparatus comprises a plasma film deposition apparatus.

\* \* \* \* \*